(12) United States Patent
Szapiro et al.

(10) Patent No.: US 8,707,131 B2
(45) Date of Patent: Apr. 22, 2014

(54) APPARATUS AND METHOD FOR FAST TAG HIT

(75) Inventors: Ariel Szapiro, Tel Aviv (IL); Alexander Gendler, Kiriat Motzkin (IL); Eugene Gorkov, Haifa (IL)

(73) Assignee: Intel Corporation, Santa Clara, CA (US)

( * ) Notice: Subject to any disclaimer, the term of this patent is extended or adjusted under 35 U.S.C. 154(b) by 459 days.

(21) Appl. No.: 13/071,871

(22) Filed: Mar. 25, 2011

(65) Prior Publication Data

US 2012/0246543 A1 Sep. 27, 2012

(51) Int. Cl.
 *G06F 11/00* (2006.01)
(52) U.S. Cl.
 USPC .......................................... 714/763; 714/768
(58) Field of Classification Search
 None
 See application file for complete search history.

(56) References Cited

U.S. PATENT DOCUMENTS

| | | | |
|---|---|---|---|
| 5,509,119 A * | 4/1996 | La Fetra | 714/52 |
| 6,226,763 B1 * | 5/2001 | Fu et al. | 714/53 |
| 2005/0289295 A1 * | 12/2005 | Shoham et al. | 711/108 |
| 2010/0185904 A1 * | 7/2010 | Chen | 714/54 |
| 2011/0161783 A1 * | 6/2011 | Somasekhar et al. | 714/768 |

* cited by examiner

*Primary Examiner* — Scott Baderman
*Assistant Examiner* — Jason Bryan
(74) *Attorney, Agent, or Firm* — Blakely, Sokoloff, Taylor & Zafman LLP (57) ABSTRACT

A method is described that includes reading a cache tag and the cache tag's corresponding ECC from storage circuitry of a cache. The method also includes generating an ECC for a search tag. The method also includes calculating a hamming distance between a) the cache tag and its corresponding ECC and b) the search tag and its corresponding ECC. The method also includes determining if the cache tag matches the search tag by comparing the hamming distance against a threshold.

15 Claims, 9 Drawing Sheets

APPARATUS AND METHOD FOR FAST TAG HIT

FIELD OF INVENTION

The field of invention is related to information processing generally, and, more specifically, to an apparatus and method for a fast tag hit.

BACKGROUND

A computing system is typically designed to store software instructions and data within the computing system's system memory. Typically there is a noticeable latency or delay associated with the storing of data into system memory and the fetching of instructions and data from the system memory. As such, in an attempt to avoid these delays/latencies where possible, many computing systems also include a cache.

A cache is a storage resource that, from the perspective of the central processing unit (CPU), has a noticeably smaller associated latency than system memory (e.g., by being located closer to the CPU than the system memory and/or being constructed with faster storage cells). Generally, the computing system attempts to store frequently used data and instructions into the cache. By storing frequently used data and instructions in the cache the average latency associated with the storage of data and/or the fetching of data and instructions is noticeably less than the latency of system memory. This reduction in average latency translates into an improvement in the performance of the computing system.

Items of data or instructions are typically stored in the cache along with their associated system memory address. If a CPU needs a particular data item or instruction item the CPU identifies it through its system memory address. The cache is then searched for the data/instruction item by searching through the addresses of the items stored within the cache. If the address of a stored item matches the address of the requested item, the cache is understood to contain the desired item ("a hit"). The item is then delivered to the CPU from the cache thereby avoiding the additional delay associated with accesses made to the system memory.

Many cache architectures are organized to partition their storage resources according to the addresses of the data/instruction items that may be stored (and searched for) in the cache. In a particular approach, the storage resources of the cache are divided into sets where each set has a plurality of storage locations referred to as ways. According to one cache search approach, a particular address that is presented to the cache for searching (a "search address") is viewed as having both a set component and a tag component. For the given search address, an appropriate set is identified based on the search address's set component. The tag component of the search address is them compared against the respective tag components of the addresses of the cached items within the ways of the set. A match corresponds to a cache hit.

Figure 1:
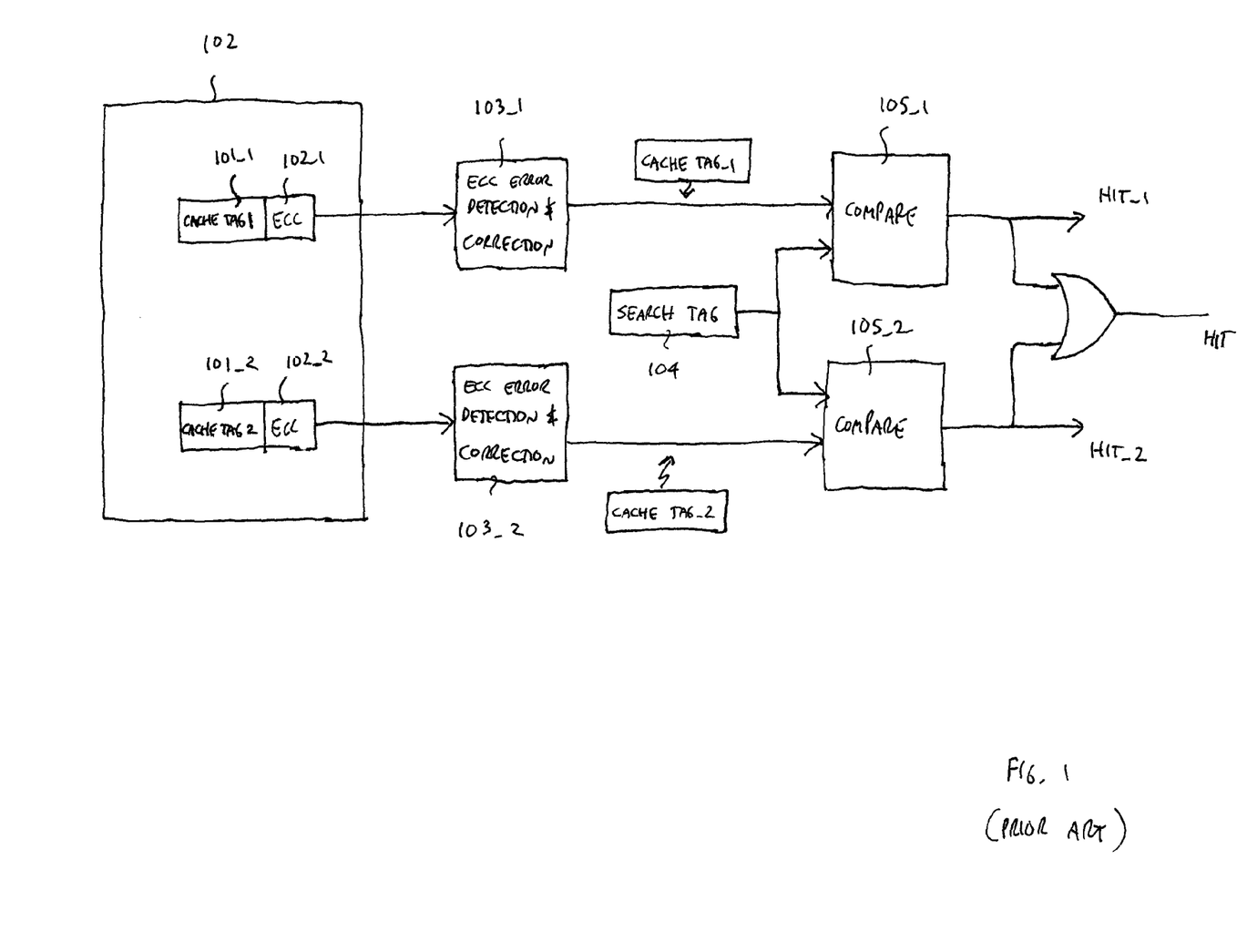
FIG. 1 shows a prior are cache search circuit.

FIG. 1 shows a typical circuit for performing such a cache search. The respective tag components 101_1, 101_2 of items cached in the respective ways of the set 102 are stored along with their own associated error correction codes (ECC) 102_1, 102_2. According to the operation of the circuit of FIG. 1, the tags of two cached items and their associated ECC codes are read from the cache substantially simultaneously. ECC checking and correction circuitry 103_1, 103_2 generates a second ECC for each tag, and, if the newly generated ECC is different than the stored ECC for the respective tag an error in the tag value is flagged and corrected.

The correct tags are then compared against the tag component 104 of the search address by respective comparison circuits 105_1, 105_2. A match found by either of the comparison circuits corresponds to a cache hit.

BRIEF DESCRIPTION OF THE DRAWINGS

The present invention is illustrated by way of example and not limitation in the figures of the accompanying drawings.

DETAILED DESCRIPTION

Figure 2:
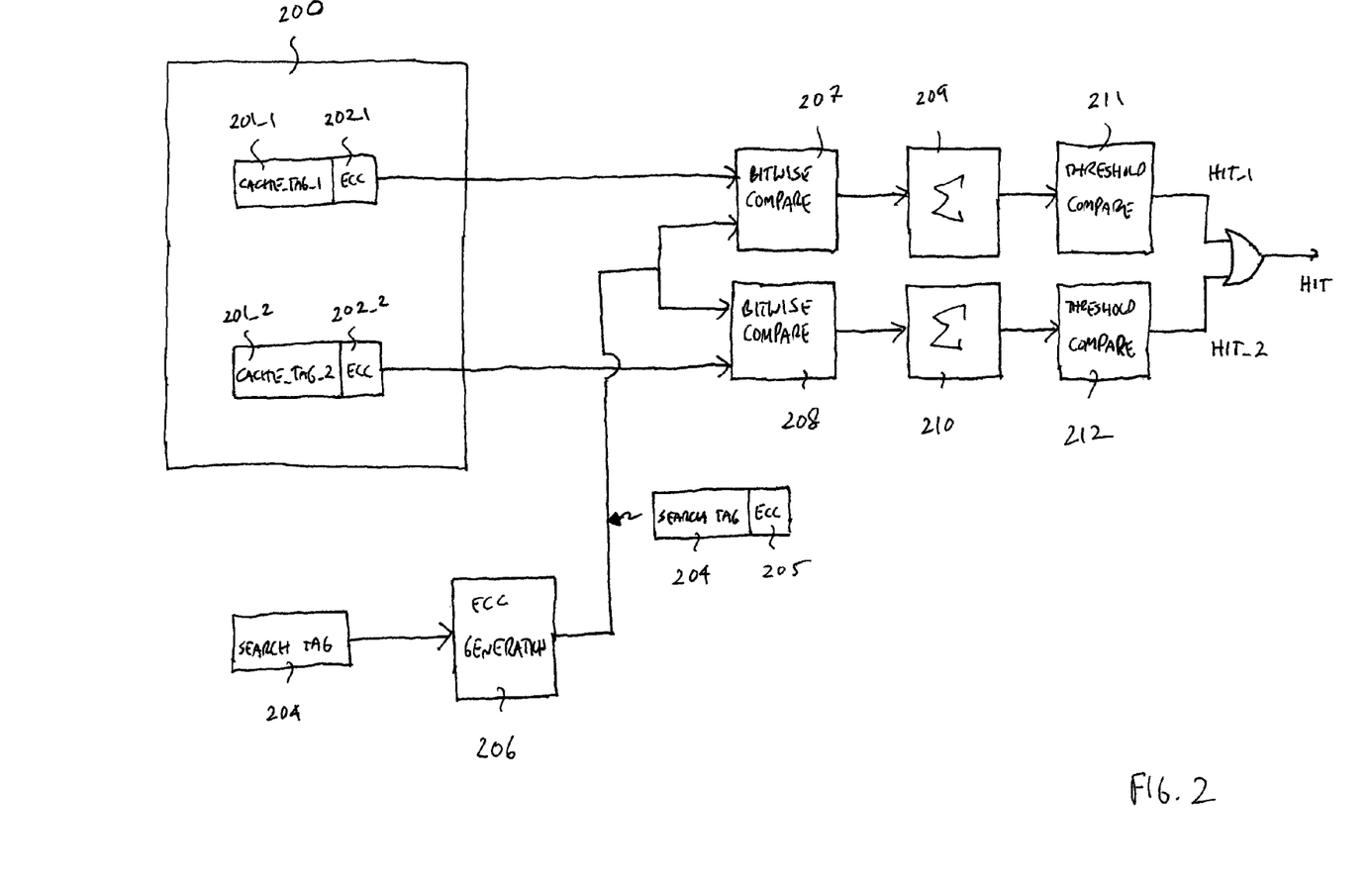
FIG. 2 shows an improved cache search circuit.

FIG. 2 shows an improved architecture that performs a cache search without checking for corruption of the cached tags prior to their comparison with the search tag. By avoiding the error checking and correction procedure between the read of the cached tag and its comparison with the search tag, the performance of the cache search process is improved. Noticeably, although the error checking and correction is not performed before the comparison, the ECC information is nevertheless utilized.

Specifically, rather than use a cached tag's ECC to identify and correct errors in the cached tags, the Hamming distance is determined between a first data structure comprised of a cached tag and its ECC and a second data structure comprised of the search tag and its ECC. A decision as to whether or not a cache hit exists is based on a comparison of the hamming distance against a threshold. A Hamming distance is essentially the number of different bits observed between a pair of equal sized data structures. For instance, the Hamming distance between words 0011001 and 1010100 is 4.

A minimal Hamming distance is a function of the error detection/correction code. In particular, viewing a tag+ECC data structure as a codeword, the minimal Hamming distance is the smallest difference in the number of bits between any two different and valid tag+ECC codewords (here, on account of the ECC component, even if the tag component is permitted to be random, it is understood that there are valid tag+ECC codewords and invalid tag+ECC codewords). For instance, if a particular error detection/correction code is characterized as having a minimal hamming distance of 4, then, any two different and valid tag+ECC data structures will have at least 4 different bits between them when the two data structures are compared.

A property of such error detection/correction codes is that, if the minimal Hamming distance is defined to be $d_m$, then, the code can be used to detect up to ceiling($(d_m-1)/2$) errors in any particular codeword and correct up to floor ($(d_m-1)/2$) errors in any particular codeword. For example, a code having a minimal Hamming distance=$d_m$=4 can detect up to 2 errors in any codeword and correct up to 1 error in any codeword.

A theory of operation of a cache hit circuit is as follows: if the Hamming distance between a cached tag+ECC data structure and a search tag+ECC data structure is calculated to be less than or equal to floor($(d_m-1)/2$), then, the two data structures can be deemed to match. Said another way, if a comparison between two codewords yields a result that is less than or equal to the ability of the code to correct an error within any particular codeword, then, the two code words can be presumed to be the same. Determining a cache hit based on this perspective avoids the need for error detection and correction of the tag values that are read from cache and therefore improves performance as compared to the circuit of FIG. 1.

According to the operation of the circuit of FIG. 2, a pair of cached tag values 201_1, 201_2 and their respective ECC values 202_1, 202_2 are read from the cache substantially simultaneously. An ECC 205 value is also generated for the search tag 204 by ECC generation circuitry 206. In an embodiment, the ECC 205 for the search tag 204 is generated by the ECC generation circuitry 206 substantially in parallel (or at least with some overlap in time) with the reading of the cached tags and their respective ECCs from the cache 200. The data structure comprised of the search tag 204 and its ECC 205 is then compared by bitwise comparison circuits 207, 208 against both of the data structures comprised respectively of one of the cached tags 201_1/201_2 and its respective ECC 202_1/202_2. In various embodiments the comparison circuits are implemented with some form of XOR gate to perform the bitwise comparison of the pair of input data structures.

Summation circuits 209, 210 then effectively add the number of bits that are different in each respective comparison. Recalling that a Hamming distance corresponds to the number of different bits between two codewords, the output of summation circuits 209, 210 corresponds to the respective Hamming distance between the search tag 204 and its ECC value 205 and one of the cached tags 201_1/201_2 and its ECC value 202_1/202_2. Recalling that an underlying philosophy of the search is that a match can be presumed if the Hamming distance between these comparisons is less than or equal to floor($(d_m-1)/2$). As such, threshold comparison circuits 211, 212 receive the respective summation values from summation circuits 209, 210 to determine if the respective summations reach the necessary threshold. For instance, in the case of $d_m=4$, threshold comparison circuits 211, 212 determine if a summation is less than or equal to 1. If the appropriate threshold is reached, a summation circuit will raise a match flag at its output.

Although FIG. 2 shows processing for a pair of cache tags and their respective ECCs, the architecture of FIG. 2 can be readily extended to process more than two cache tags and their ECCs at a time for a single search tag, or, may be reduced to only process a single cache tag and its ECC at a time. Moreover, although the circuit of FIG. 2 is understood to be instantiated for a single set within a cache, such a circuit could be instantiated multiple times (e.g., one such circuit for each set of a cache).

Figure 3:
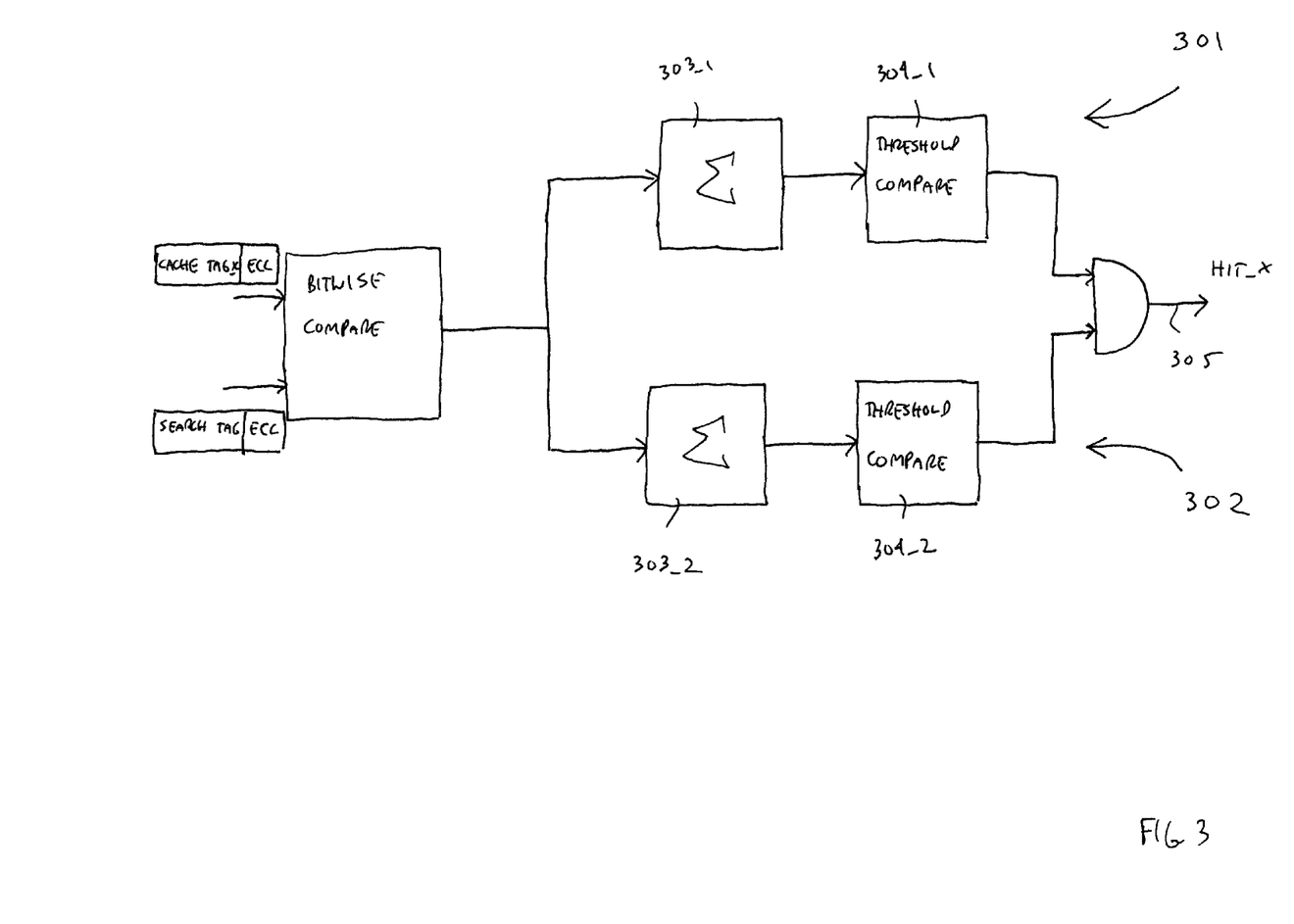
FIG. 3 shows an embodiment of a summation circuit and threshold comparison circuit.

FIG. 3 shows a circuit for an embodiment of the summation circuit and threshold circuit chain for a single bitwise comparison result (e.g., the output of only one of the comparison circuits 207, 208 of FIG. 2). As observed in FIG. 3, the bitwise comparison result is split into two sections (e.g., an odd half 301 and an even half 302). Separate summations are performed over the two sections with summation circuits 303_1, 303_2. Each summation result is screened against a threshold with a respective threshold comparison circuit 304_1, 304_2. If a sought for threshold (e.g., less than or equal to 1) is reached in both comparison circuits 304_1, 304_2 a match is declared at output 305. In an embodiment where section 301 corresponds to an least significant half and section 302 corresponds to a most significant half, the circuit of FIG. 3 is essentially calculates a first Hamming distance for the most significant bits and a second Hamming distance for the least significant bits. In an alternate embodiment, first and second Hamming distances can be calculated for odd and even halves. Then, the circuit performs a threshold determination (e.g., floor($(d_m-1)/2$)) for both the odd half and the even half. If both the odd and even halves reach the threshold a match is declared. This particular technique is based on an understanding/analysis of the particular bit patterns that a particular coding algorithm can produce and/or its underlying mathematics.

Figure 4A:
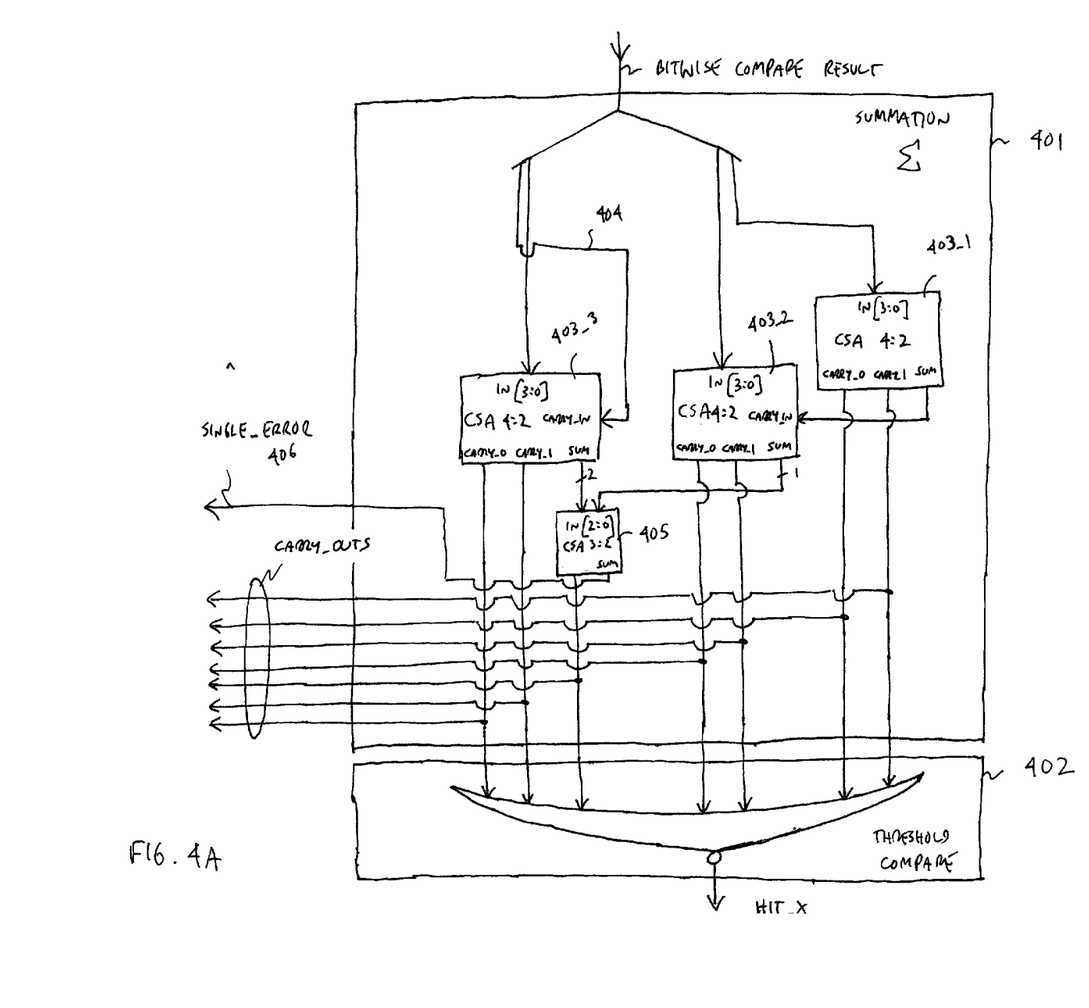
FIG. 4a shows an embodiment of a summation circuit.

FIG. 4a shows an embodiment of the circuitry that may be used to implement one of the sections 301, 302 of FIG. 3. Here, for instance, region 401 corresponds to one of the summation circuits 303_1/303_2 and region 402 corresponds to a corresponding one of the following comparison circuits 304_1/304_2. Here, 4:2 carry sum adders 403_1, 403_2, 403_3 are organized such that: i) a lower ordered adder's summation term is carried over as the next higher ordered adder's carry term; ii) carry terms represent actual summation results and are therefore presented to the threshold comparison stage 402. For example carry sum adder 403_1 accepts the lowest ordered bits from the bitwise compare result and carry sum adder 403_2 accepts the next highest order bits from the bitwise compare result. Remaining highest ordered input bits 404 are carried into the carry term of the highest ordered 4:2 adder 403_3. Notably, only three carry sum adders are shown, but more can be included according to the architectural scheme.

In the case of a pure match all the carry terms presented to the threshold comparison stage 402 will be zero. If any of the carry terms is a 1 it corresponds to a summation result greater than 1. Therefore, as all carry terms equal to zero corresponds to a match and any carry term equal to 1 corresponds to no match, a NOR gate can be used to implement the threshold comparison function 402.

The circuit also includes a 3:2 adder 405. The carry term from the 3:2 adder 405 is presented to the threshold comparison stage to flag a tag match. The sum term 406, which corresponds to the least significant bit of the total sum, is used downstream as described in more detail below to generate an error signal.

Figure 4B:
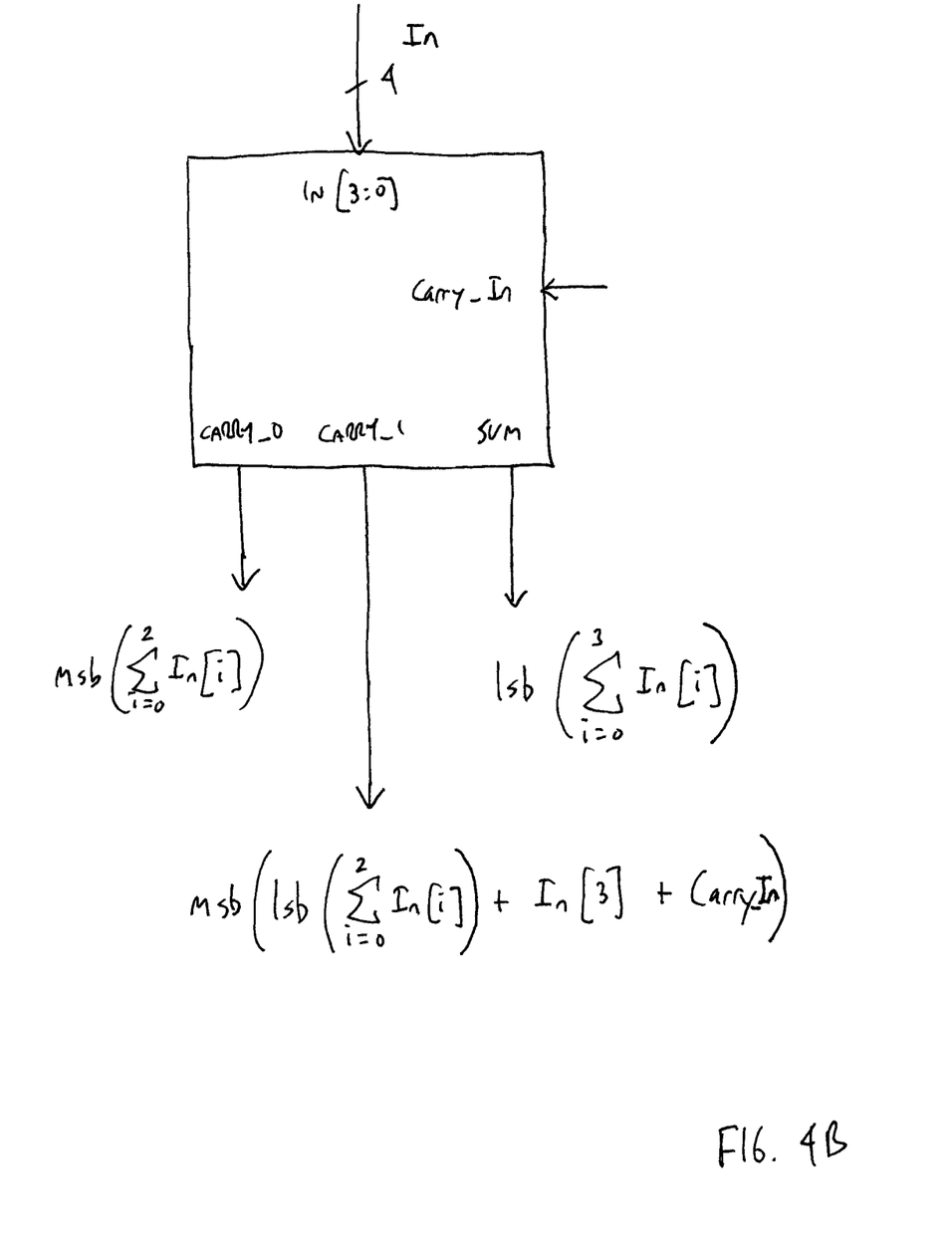
FIG. 4b shows an embodiment of a carry-sum-adder.

FIG. 4b shows an embodiment of one of the 4:2 adders. As observed in FIG. 4b the 4:2 adder includes logic circuitry to: 1) produce the least significant bit (lsb) of the summation of all four inputs at the summation output (SUM); 2) produce the most significant bit (msb) of the summation of the three lowest ordered input bits; and, 3) produce the most significant bit of the summation of the highest ordered input bit (ln[3]) and the summation of the three lowest ordered input bits.

Figure 5:
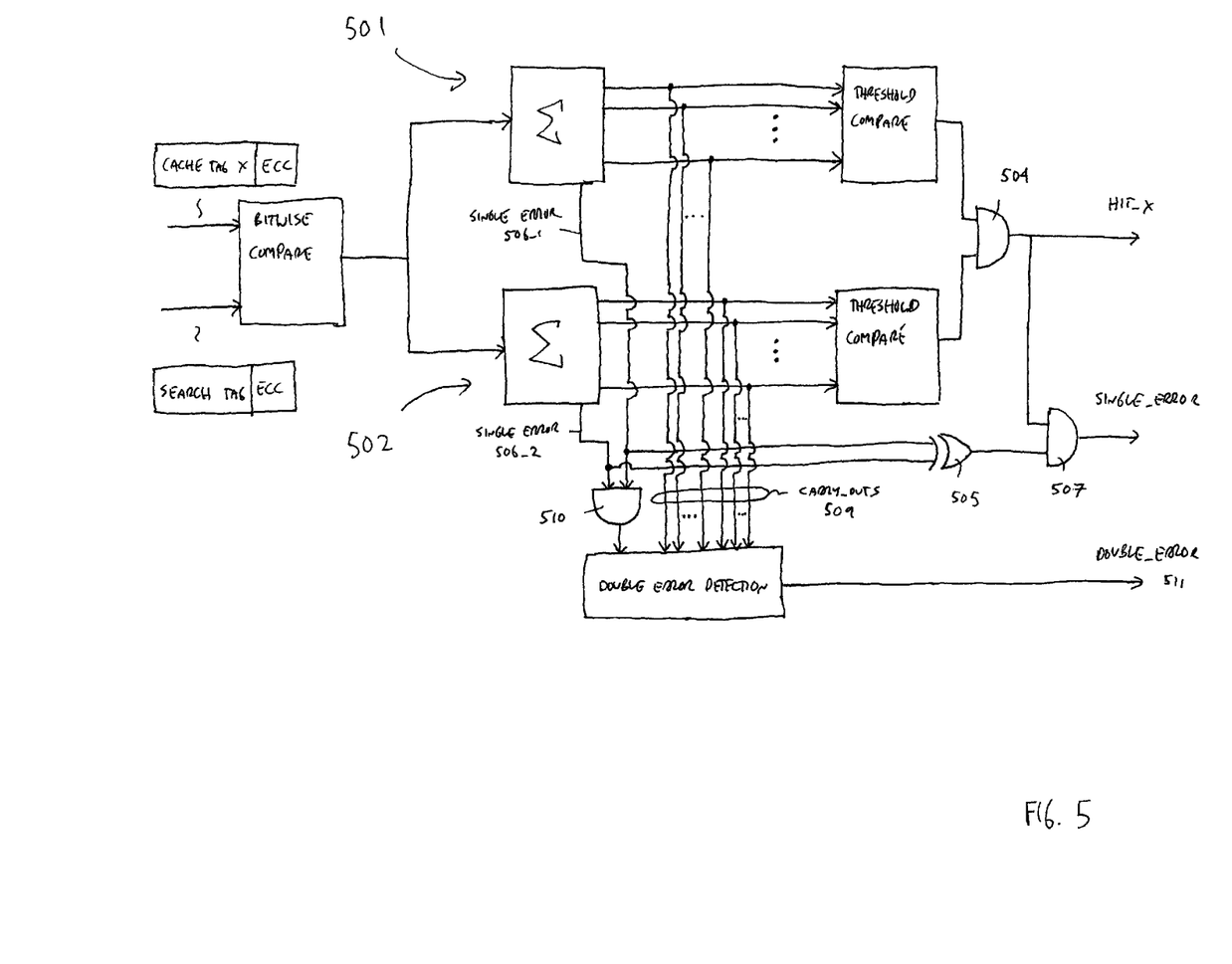
FIG. 5 shows a channel for detecting a tag match.

FIG. 5 shows an embodiment of a complete summation and threshold compare channel for a single cache tag+ECC/search tag+ECC comparison that uses the approach of FIGS. 3 and 4a,b. Here, the result of the tag+ECC bitwise comparison is viewed as an input. The channel is split into a first (e.g., even) section 501 and a second (e.g., odd) section 502. Both the first and second sections 501, 502 contain channel processing like that observed in FIG. 4b. Notably, the single error output 406 of both channels 506_1, 506_2 are together fed to an EXCLUSIVE OR gate 505 that will raise a logic high signal if one of the error terms 506_1/506_2 is raised high but not the other. If this situation arises and both channels find a match (i.e., the inputs to AND gate 504 are high), then the output of AND gate 507 raises high signifying there is an error in one of the codewords. That is, according to the particular encoding scheme employed, if both channels find a match but only one of the channels detect an error, an error exists in one of the input codewords.

The circuit of FIG. 5 also collects all the carry terms 509 from the carry sum adders in both channels and adds them along with the output of AND gate 510. If the summation result of the addition results in a 1, a double error signal 511 is raised. Here, double error detection (DED) is also supported by the particular encoding algorithm.

Figure 6:
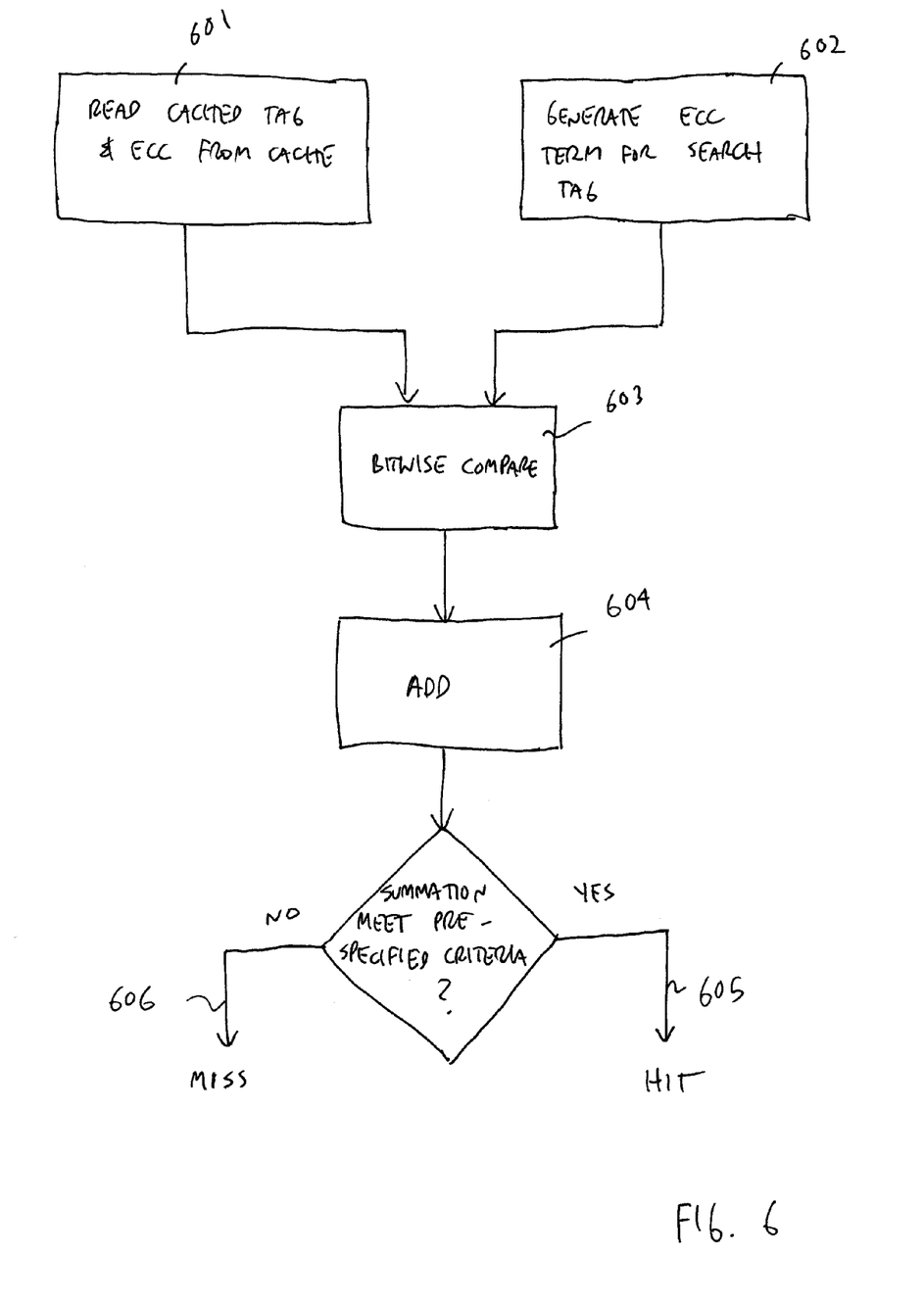
FIG. 6 shows a methodology for detecting a tag match.

FIG. 6 shows a methodology that various circuit structures discussed above can operate according to. Referring to FIG. 6, a cached tag and its respective ECC is read from a cache 601 while an ECC term is generated for a search tag 602. The search tag and its ECC is bitwise compared against the cache tag and its respective ECC 603. Resultant bits of the bitwise comparison are added 604. If the result of the addition 604 meets a pre-specified criteria (e.g., less than or equal to 1) then a match is declared 605, else no match is declared 606. Notably, the above process can be executed in parallel for more than one cache tag and respective ECC(s) for a single search tag.

Figure 7:
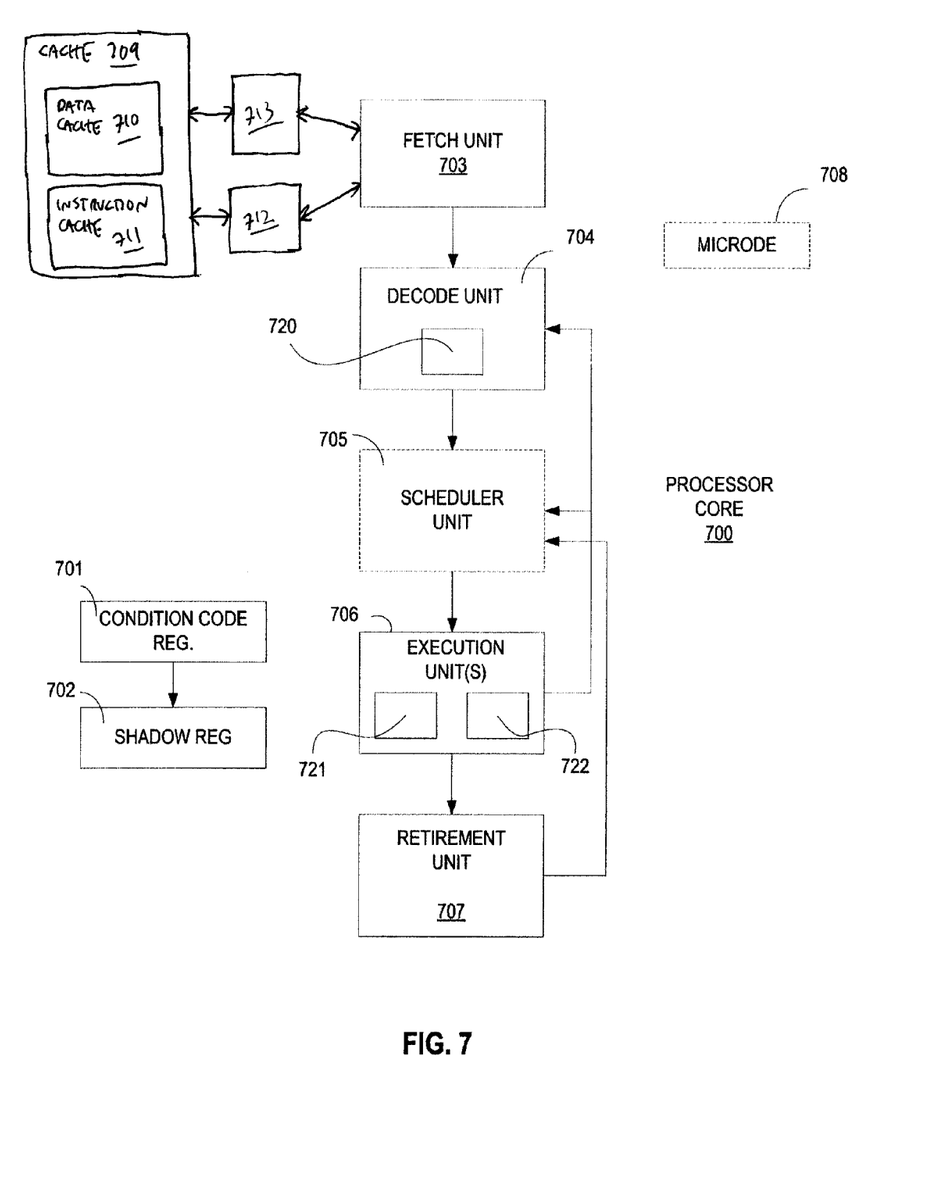
FIG. 7 shows a processor having improved tag match detection circuitry.

FIG. 7 shows a generic processing core 700 that is believed to describe many different types of processing core architectures such as Complex Instruction Set (CISC), Reduced Instruction Set (RISC) and Very Long Instruction Word (VLIW). The generic processing core 700 of FIG. 7 includes: 1) a fetch unit 703 that fetches instructions and/or data (e.g., from a cache 709 or memory); 2) a decode unit 704 that decodes instructions; 3) a schedule unit 705 that determines the timing and/or order of instruction issuance to the execution units 706 (notably the scheduler is optional); 4) execution units 706 that execute the instructions; 5) a retirement unit 707 that signifies successful completion of an instruction. Notably, the processing core may or may not include microcode 708, partially or wholly, to control the micro operations of the execution units 706.

The cache is observed to include both a data cache 710 and an instruction cache 711. Associated with each cache 710, 711 is an instruction cache search circuit 712 and a data cache search circuit 713. Notably, either or both of the cache search circuits 712, 713 may be designed to include any of the cache search techniques and/or circuits described above with respect to FIGS. 2 through 6. These circuits 712, 713, like the processing core 700 may be implemented with electronic circuitry such as logic circuitry implemented on a semiconductor chip.

Figure 8:
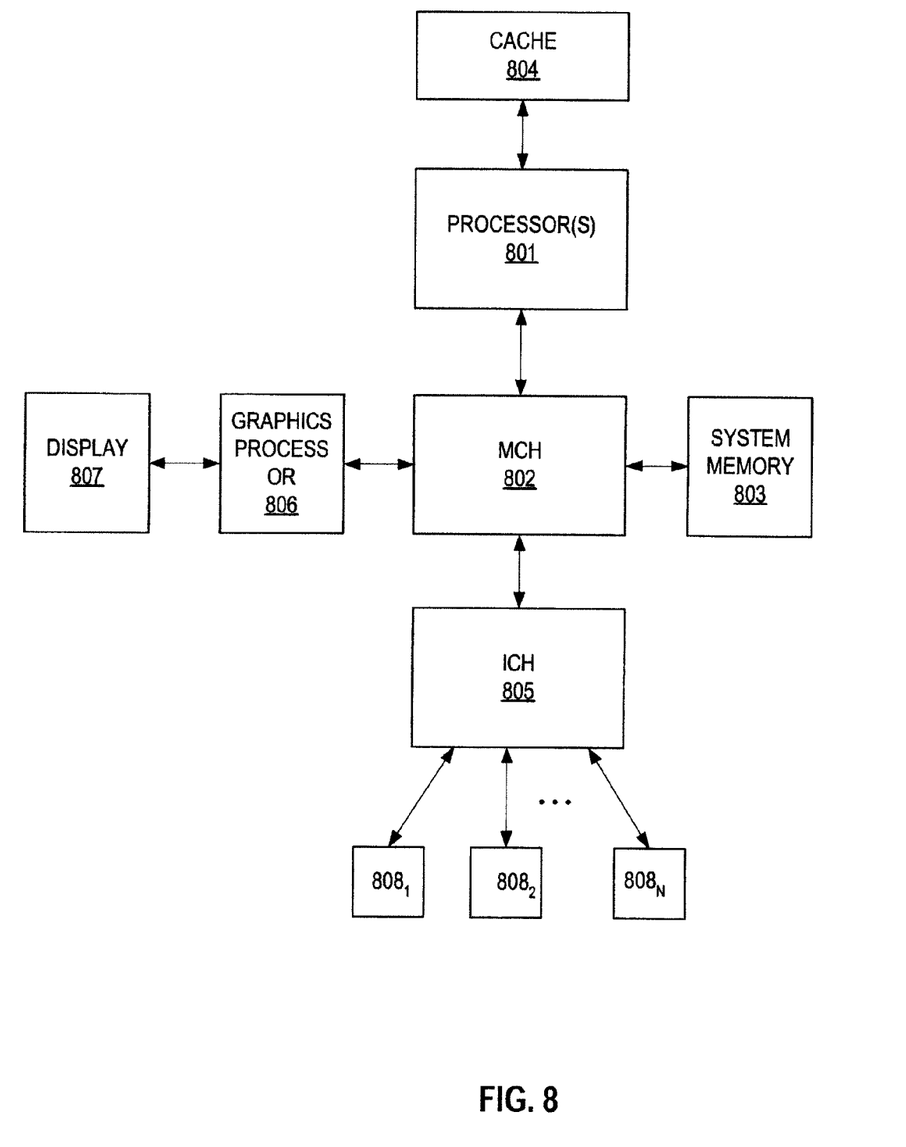
FIG. 8 shows a computing system.

A processing core having the functionality described above can be implemented into various computing systems as well. FIG. 8 shows an embodiment of a computing system (e.g., a computer). The exemplary computing system of FIG. 8 includes: 1) one or more processing cores 801 that may be designed to include two and three register scalar integer and vector instruction execution; 2) a memory control hub (MCH) 802; 3) a system memory 803 (of which different types exist such as DDR RAM, EDO RAM, etc.); 4) a cache 804; 5) an I/O control hub (ICH) 805; 6) a graphics processor 806; 7) a display/screen 807 (of which different types exist such as Cathode Ray Tube (CRT), flat panel, Thin Film Transistor (TFT), Liquid Crystal Display (LCD), DPL, etc.) one or more I/O devices 808.

The one or more processing cores 801 execute instructions in order to perform whatever software routines the computing system implements. The instructions frequently involve some sort of operation performed upon data. Both data and instructions are stored in system memory 803 and cache 804. Cache 804 is typically designed to have shorter latency times than system memory 803. For example, cache 804 might be integrated onto the same silicon chip(s) as the processor(s) and/or constructed with faster SRAM cells whilst system memory 803 might be constructed with slower DRAM cells. By tending to store more frequently used instructions and data in the cache 804 as opposed to the system memory 803, the overall performance efficiency of the computing system improves.

System memory 803 is deliberately made available to other components within the computing system. For example, the data received from various interfaces to the computing system (e.g., keyboard and mouse, printer port, LAN port, modem port, etc.) or retrieved from an internal storage element of the computing system (e.g., hard disk drive) are often temporarily queued into system memory 803 prior to their being operated upon by the one or more processor(s) 801 in the implementation of a software program. Similarly, data that a software program determines should be sent from the computing system to an outside entity through one of the computing system interfaces, or stored into an internal storage element, is often temporarily queued in system memory 803 prior to its being transmitted or stored.

The ICH 805 is responsible for ensuring that such data is properly passed between the system memory 803 and its appropriate corresponding computing system interface (and internal storage device if the computing system is so designed). The MCH 802 is responsible for managing the various contending requests for system memory 803 access amongst the processor(s) 801, interfaces and internal storage elements that may proximately arise in time with respect to one another.

One or more I/O devices 808 are also implemented in a typical computing system. I/O devices generally are responsible for transferring data to and/or from the computing system (e.g., a networking adapter); or, for large scale nonvolatile storage within the computing system (e.g., hard disk drive or semiconductor non volatile storage device that is the main store for the system's program code when the system is powered off). ICH 805 has bi-directional point-to-point links between itself and the observed I/O devices 808.

Processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.)), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

It is believed that processes taught by the discussion above may also be described in source level program code in various object-orientated or non-object-orientated computer programming languages (e.g., Java, C#, VB, Python, C, C++, J#, APL, Cobol, Fortran, Pascal, Perl, etc.) supported by various software development frameworks (e.g., Microsoft Corporation's .NET, Mono, Java, Oracle Corporation's Fusion, etc.). The source level program code may be converted into an intermediate form of program code (such as Java byte code, Microsoft Intermediate Language, etc.) that is understandable to an abstract execution environment (e.g., a Java Virtual Machine, a Common Language Runtime, a high-level language virtual machine, an interpreter, etc.) or may be compiled directly into object code.

According to various approaches the abstract execution environment may convert the intermediate form program code into processor specific code by, 1) compiling the intermediate form program code (e.g., at run-time (e.g., a JIT compiler)), 2) interpreting the intermediate form program code, or 3) a combination of compiling the intermediate form program code at run-time and interpreting the intermediate form program code. Abstract execution environments may run on various operating systems (such as UNIX, LINUX, Microsoft operating systems including the Windows family, Apple Computers operating systems including MacOS X, Sun/Solaris, OS/2, Novell, etc.).\

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
   reading a cache tag and said cache tag's corresponding ECC from storage circuitry of a cache;
   generating an ECC for a search tag;
   calculating a hamming distance between a) and b) below:
      a) said cache tag and its corresponding ECC and b) said search tag and its corresponding ECC by
      performing a bitwise compare of said cache tag and its ECC and said search tag and its ECC,
      dividing signals lines resulting from the bitwise compare into different portions and performing the following with each respective portion:
         x) performing a summation over the portion's bits,
         y) comparing the summation against a threshold, and,
      signaling a match if the comparing for each portion yields a looked for result; and
   determining if said cache tag matches said search tag by comparing said hamming distance against a threshold.

2. The method of claim 1 wherein said reading and said generating are performed concurrently.

3. The method of claim 2 further comprising:
   reading a second cache tag and said second cache tag's corresponding ECC from said storage circuitry concurrently with said reading of said cache tag and said cache tag's corresponding ECC storage from said storage circuitry;
   calculating a hamming distance between c) and d) below concurrently with said calculating of said hamming distance between a) and b) above:
      c) said second cache tag and its corresponding KC;
      d) said search tag and its corresponding ECC.

4. The method of claim 3 further comprising determining if said second cache tag matches said search tag by comparing said hamming distance between c) and d) above concurrently with said determining if said cache tag matches said search tag.

5. The method of claim 1 wherein said method further comprises detecting a single error.

6. The method of claim 1 wherein said method further comprises detecting a double error.

7. A semiconductor chip comprising cache circuitry, said cache circuitry comprising:
   a) storage circuitry to store a cache tag and its corresponding KC;
   b) ECC generation circuitry to generate an ECC for a search tag;
   c) exclusive OR bitwise comparison circuitry to perform a bitwise comparison of i) and ii) below:
      i) said cache tag and its KC;
      ii) said search tag and its KC;
   d) summation circuitry to sum over results of c) above; and
   e) threshold comparison circuitry to determine if said search tag matches said cache tag by comparing said sum against a threshold, wherein resultant signal lines from said exclusive OR bitwise comparison circuitry flow into respective channels each comprising its own respective summation circuit and its own respective threshold detection circuit downstream from said respective summation circuit.

8. The semiconductor chip of claim 7 where said threshold comparison circuitry comprises OR logic circuitry.

9. The semiconductor chip of claim 7 wherein said summation circuitry comprises multiple carry sum adders arranged such that a carry sum adder that accepts lower ordered results of c) provides its sum to a carry term input of a carry sum adder that accepts higher ordered results of c).

10. The semiconductor chip of claim 9 where carry term outputs of said carry sum adders couple into error detection circuitry.

11. The semiconductor chip of claim 7 further comprising double error detection circuitry having input nodes coupled to signal lines coupled between m) and n) above.

12. A computing system, comprising:
   a semiconductor non volatile storage device to store the computing system's program code when the computer system is powered off;
   a processor;
   cache circuitry coupled to the processor, the cache circuitry including:
      a) storage circuitry to store a cache tag and its corresponding KC;
      b) ECC generation circuitry to generate an ECC for a search tag;
      c) exclusive OR bitwise comparison circuitry to perform a bitwise comparison of i) and ii) below:
         i) said cache tag and its KC;
         ii) said search tag and its KC;
      d) summation circuitry to sum over results of c) above; and
      e) threshold comparison circuitry to determine if said search tag matches said cache tag by comparing said sum against a threshold, wherein resultant signal lines from said exclusive OR bitwise comparison circuitry flow into respective channels each comprising its own respective summation circuit and its own respective threshold detection circuit downstream from said respective summation circuit.

13. The computing system of claim 12 where said threshold comparison circuitry comprises OR logic circuitry.

14. The computing system of claim 12 wherein said summation circuitry comprises multiple carry sum adders arranged such that a carry sum adder that accepts lower ordered results of c) provides its sum to a carry term input of a carry sum adder that accepts higher ordered results of c).

15. The computing system of claim 14 where carry term outputs of said carry sum adders couple into error detection circuitry.

* * * * *